United States Patent
Nishimura et al.

(10) Patent No.: US 10,609,803 B2
(45) Date of Patent: Mar. 31, 2020

(54) EXTREME ULTRAVIOLET (EUV) LIGHT GENERATING APPARATUS AND CONTROL METHOD FOR CENTROID OF EUV LIGHT

(71) Applicant: Gigaphoton Inc., Tochigi (JP)

(72) Inventors: Yuichi Nishimura, Oyama (JP); Yoshifumi Ueno, Oyama (JP); Takayuki Yabu, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/532,124

(22) Filed: Aug. 5, 2019

(65) Prior Publication Data

US 2019/0361361 A1 Nov. 28, 2019

Related U.S. Application Data

(63) Continuation of application No. PCT/JP2017/012450, filed on Mar. 27, 2017.

(51) Int. Cl.
*H05G 2/00* (2006.01)
*H01S 3/00* (2006.01)
(Continued)

(52) U.S. Cl.
CPC ........... *H05G 2/005* (2013.01); *H01S 3/0071* (2013.01); *H01S 3/2391* (2013.01); *H05G 2/00* (2013.01);
(Continued)

(58) Field of Classification Search
CPC .............. G03F 7/70033; G03F 7/7085; G03F 7/70525; G03F 7/7055; G03F 9/7046;
(Continued)

(56) References Cited

U.S. PATENT DOCUMENTS

| | | |
|---|---|---|
| 8,598,552 B1 | 12/2013 | Frihauf et al. |
| 8,993,976 B2 | 3/2015 | Graham et al. |

(Continued)

FOREIGN PATENT DOCUMENTS

| | | | |
|---|---|---|---|
| JP | 2007-109451 A | | 4/2007 |
| JP | 2007109451 A | * | 4/2007 |

(Continued)

OTHER PUBLICATIONS

International Search Report issued in PCT/JP2017/012450; dated Aug. 15, 2017.

(Continued)

*Primary Examiner* — Michelle M Iacoletti
(74) *Attorney, Agent, or Firm* — Studebaker & Brackett PC

(57) ABSTRACT

An EUV light generating apparatus includes: EUV light sensors configured to measure energy of EUV light from mutually different directions, the EUV light being generated by applying laser light to a target supplied to a predetermined region in a chamber; an application position adjusting unit configured to adjust an application position of the laser light to the target supplied to the predetermined region; and a controller configured to control the application position adjusting unit such that a centroid of the EUV light becomes a target desired centroid, the centroid of the EUV light being specified from measurement results of the EUV light sensors. The controller calibrates the target desired centroid based on EUV light centroids obtained from the energy of the EUV light measured by the EUV light sensors, and a parameter related to the measured energy of the EUV light corresponding to the EUV light centroids.

13 Claims, 11 Drawing Sheets

(51) Int. Cl.
*H01S 3/23* (2006.01)
*G03F 7/20* (2006.01)

(52) U.S. Cl.
CPC ......... *H05G 2/006* (2013.01); *G03F 7/70033* (2013.01); *G03F 7/70641* (2013.01)

(58) Field of Classification Search
CPC .... G03F 9/7049; G03F 9/7076; G03F 9/7084; G03F 9/7088; G03F 9/7092; G03F 7/20; H01S 3/0071; H01S 3/2391; G01J 1/4257; G01J 1/429
See application file for complete search history.

(56) References Cited

U.S. PATENT DOCUMENTS

| | | |
|---|---|---|
| 9,536,631 B1 | 1/2017 | Riggs |
| 2012/0228525 A1 | 9/2012 | Moriya et al. |
| 2013/0043401 A1* | 2/2013 | Graham ................ H05G 2/003 250/372 |
| 2014/0111635 A1 | 4/2014 | Suzuki et al. |
| 2015/0168848 A1 | 6/2015 | Tanaka et al. |

FOREIGN PATENT DOCUMENTS

| | | |
|---|---|---|
| JP | 2012-199512 A | 10/2012 |
| JP | 2014-086523 A | 5/2014 |
| JP | 2014-531743 A | 11/2014 |
| JP | 2015-524599 A | 8/2015 |
| WO | 2014/006193 A1 | 1/2014 |
| WO | 2014/030645 A1 | 2/2014 |

OTHER PUBLICATIONS

International Preliminary Report on Patentability and Written Opinion issued in PCT/JP2017/012450; dated Oct. 1, 2019.

* cited by examiner

EXTREME ULTRAVIOLET (EUV) LIGHT GENERATING APPARATUS AND CONTROL METHOD FOR CENTROID OF EUV LIGHT

CROSS-REFERENCE TO RELATED APPLICATIONS

The present application is a continuation application of International Application No. PCT/JP2017/012450 filed on Mar. 27, 2017. The contents of the applications are incorporated herein by reference in its entirety.

BACKGROUND

1. Technical Field

The present disclosure relates to an EUV light generating apparatus and a control method for a centroid of EUV light.

2. Related Art

In recent years, with the miniaturization of semiconductor process, the miniaturization of the transcription pattern in optical lithography of the semiconductor process has rapidly progressed. In the next generation, fine processing of 20 nm or less will be demanded. Therefore, it is expected to develop an exposure apparatus in which an extreme ultraviolet (EUV) light generating apparatus to generate extreme ultraviolet (EUV) light with a wavelength of about 13 nm and a reduced projection reflective optical system are combined.

As the EUV light generating apparatus, there have been proposed three types of apparatuses: an LPP (Laser Produced Plasma) type apparatus using plasma that is generated by applying laser light to a target; a DDP (Discharge Produced Plasma) type apparatus using plasma that is generated by discharge, and an SR (Synchrotron Radiation) type apparatus using orbital radiation.

LIST OF DOCUMENTS

Patent Document

Patent Document 1: U.S. Pat. No. 8,598,552
Patent Document 2: U.S. Pat. No. 8,993,976

SUMMARY

An EUV light generating apparatus according to an aspect of the present disclosure includes: a plurality of EUV light sensors configured to measure energy of EUV light from mutually different directions, the EUV light being generated by applying laser light to a target supplied to a predetermined region in a chamber; an application position adjusting unit configured to adjust an application position of the laser light to the target supplied to the predetermined region; and a controller configured to control the application position adjusting unit such that a centroid of the EUV light becomes a desired centroid, the centroid of the EUV light being specified from measurement results of the EUV light sensors. The controller calibrates the desired centroid based on a plurality of EUV light centroids obtained from the energy of the EUV light measured by the EUV light sensors, and a parameter related to energy of laser light applied to the EUV light centroids.

An EUV light generating apparatus according to another aspect of the present disclosure includes: a plurality of EUV light sensors configured to measure energy of EUV light from mutually different directions, the EUV light being generated by applying laser light to a target supplied to a predetermined region in a chamber; an application position adjusting unit configured to adjust an application position of the laser light to the target supplied to the predetermined region; and a controller configured to control the application position adjusting unit such that a centroid of the EUV light becomes a desired centroid, the centroid of the EUV light being specified from measurement results of the EUV light sensors. The controller calibrates the desired centroid based on a plurality of EUV light centroids obtained from the energy of the EUV light measured by the EUV light sensors, and a parameter related to energy of laser light applied to the EUV light centroids.

A control method for a centroid of an EUV light according to another aspect of the present disclosure is a method of controlling a centroid of EUV light generated by applying laser light to a target. The method includes measuring energy of the EUV light from mutually different directions; and calibrating a desired centroid based on a plurality of EUV light centroids obtained from the measured energy of the EUV light, and a parameter related to the measured energy of the EUV light corresponding to the EUV light centroids.

BRIEF DESCRIPTION OF THE DRAWINGS

Some embodiments of the present disclosure, as just examples, will be described below, with reference to the accompanying drawings.

DESCRIPTION OF EMBODIMENTS

Figure 1:
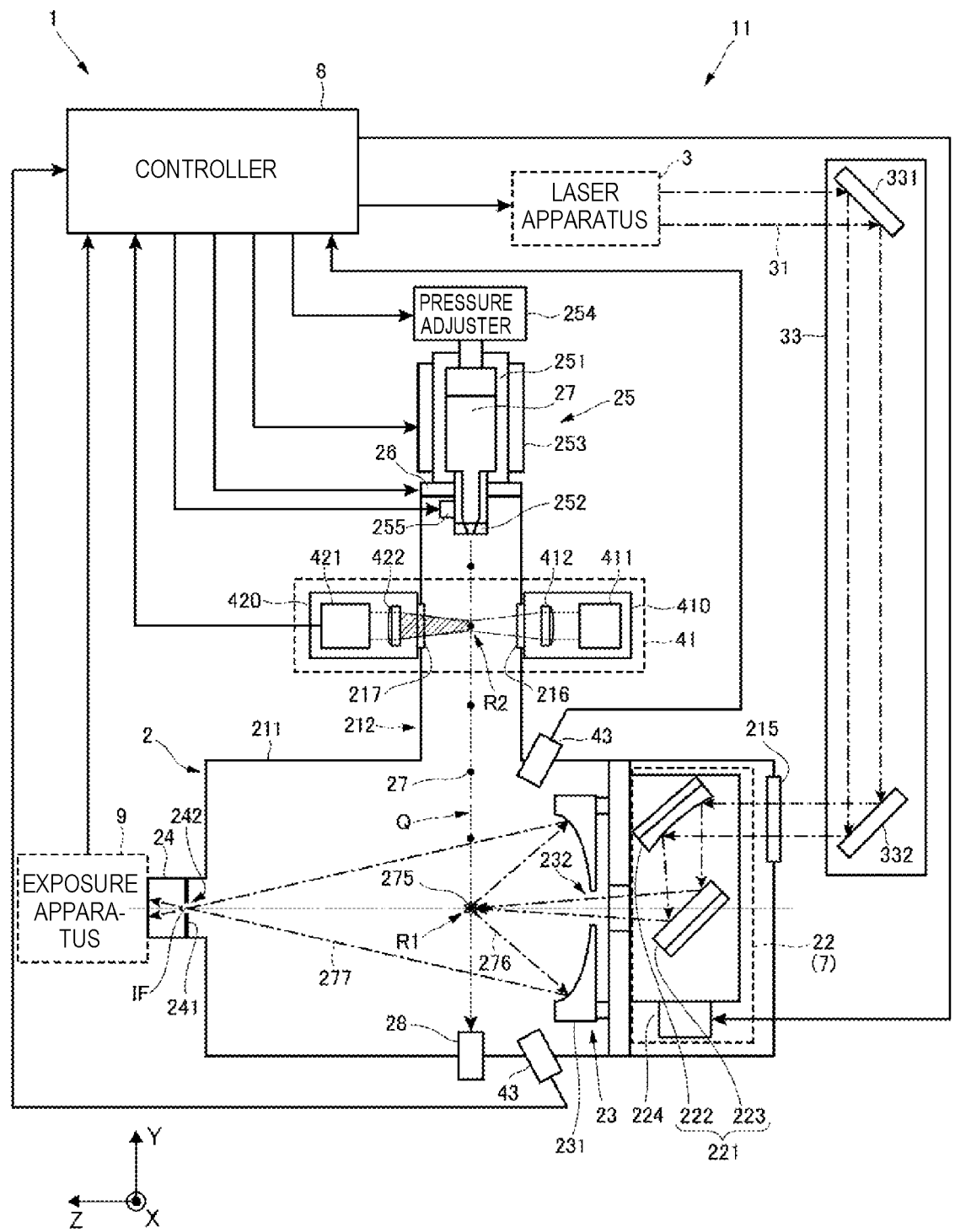
FIG. 1 shows a diagram for describing the configuration of an EUV light generating apparatus of a comparative example.

<Contents>
1. Terms
2. Problem
   2.1 Configuration of Comparative Example
   2.2 Operation of Comparative Example
   2.3 EUV Light Sensor and Centroid Control of EUV Light
   2.4 Problem
3. First Embodiment
   3.1 Configuration
   3.2 Operation
   3.3 Effect
4. Second Embodiment
   4.1 Configuration
   4.2 Operation
   4.3 Effect
5. Third Embodiment
   5.1 Configuration
   5.2 Operation
   5.3 Effect
6. Others Hereinafter, embodiments of the present disclosure will be described in detail, with reference to the drawings. The embodiments described below show some examples of the present disclosure, and do not limit the content of the present disclosure. Further, not all of the configurations and operations described in the embodiments are necessarily essential as the configuration and operation of the present disclosure. Identical elements are denoted by identical reference symbols, and repetitive descriptions are omitted.

1. Terms

"Target" is an object to be irradiated with laser light that is introduced into a chamber. The target to which the laser light has been applied generates plasma to radiate the light including EUV light.

"Plasma generation region" is a predetermined region in the chamber. The plasma generation region is a region where the laser light is applied to the target put into the chamber and the target generates plasma.

"Target trajectory" is a path through which the target put into the chamber travels. The target trajectory crosses the optical path of the laser light introduced into the chamber, in the plasma generation region.

"Optical path axis" is an axis that passes through the center of a beam cross-section of the laser light along the traveling direction of the laser light.

"Optical path" is a path along which the laser light passes. The optical path contains the optical path axis.

"Z-axis direction" is the traveling direction of the laser light when the laser light introduced into the chamber travels toward the plasma generation region. The Z-axis direction may be roughly the same as a direction in which the EUV light generating apparatus outputs the EUV light.

"Y-axis direction" is a direction opposite to a direction in which a target supply device outputs the target to the chamber. The Y-axis direction is a direction perpendicular to the X-axis direction and the Z-axis direction.

"X-axis direction" is a direction perpendicular to the Y-axis direction and the Z-axis direction.

"Burst light emission" by the EUV light generating apparatus is to repeatedly emit the EUV light at a relatively high frequency in a predetermined period. The above predetermined period is also called "burst light emission period". Typically, the burst light emission period is set to be repeated with a predetermined stop period. That is, in each burst light emission period, a set of EUV light that is emitted in pulses at a high frequency is output.

2. Problem

An EUV light generating apparatus 1 of a comparative example will be described with use of FIG. 1 to FIG. 3. The EUV light generating apparatus 1 of the comparative example is an LPP type EUV light generating apparatus. The EUV light generating apparatus 1 is used together with at least one laser apparatus 3. A system including the EUV light generating apparatus 1 and the laser apparatus 3 is also referred to as an EUV light generating system 11.

The EUV light generating apparatus 1 generates a plasma 275 of a target 27, by applying, to the target 27, at least one pulsed laser light 31 output from the laser apparatus 3. The generated plasma 275 radiates radiation light 276. In addition to the EUV light 277, the radiation light 276 includes light beams having various wavelengths. The EUV light generating apparatus 1 captures the EUV light 277 included in the radiation light 276, and outputs the EUV light 277 to an exposure apparatus 9. In this way, the EUV light generating apparatus 1 can generate the EUV light 277.

[2.1 Configuration of Comparative Example]

FIG. 1 is a diagram for describing the configuration of the EUV light generating apparatus 1 of the comparative example. The EUV light generating apparatus 1 of the comparative example includes a chamber 2, a laser light focusing optical system 22, an EUV light focusing optical system 23, a connection part 24, and a laser light delivery optical system 33. In addition, the EUV light generating apparatus 1 of the comparative example includes a target supply device 25, a stage 26, a target collector 28, a target detecting sensor 41, an EUV light sensor 43, and a controller 8.

The chamber 2 is a container in which pulsed laser light 31 is applied to the target 27 supplied to the interior so that the plasma 275 is generated from the target 27 and the EUV light 277 is generated. A wall 211 of the chamber 2 forms the internal space of the chamber 2, and separates the internal space of the chamber 2 from the exterior. The wall 211 is provided with a window 215 for introducing the pulsed laser light 31 into the chamber 2. The chamber 2 contains a target supply channel 212 for supplying the target 27 into the chamber 2.

The laser light delivery optical system 33 introduces the pulsed laser light 31 output from the laser apparatus 3, into the chamber 2 through the window 215. The laser light delivery optical system 33 is disposed in the exterior of the chamber 2. The laser light delivery optical system 33 is disposed on the optical path of the pulsed laser light 31 output from the laser apparatus 3, between the laser apparatus 3 and the window 215. The laser light delivery optical system 33 includes a high reflectance mirror 331 and a high reflectance mirror 332. Each of the high reflectance mirrors 331, 332 is mounted on an unillustrated stage that adjusts at least one of the position and the attitude. The operation of the stages on which the high reflectance mirrors 331, 332 are mounted is controlled by the controller 8.

The laser light focusing optical system 22 focuses the pulsed laser light 31 introduced into the chamber 2 through the window 215, on a plasma generation region R1. The laser light focusing optical system 22 is disposed at the interior of the chamber 2. The laser light focusing optical system 22 is disposed on the optical path of the pulsed laser light 31 having passed through the window 215, between the window 215 and the plasma generation region R1. The laser light focusing optical system 22 includes a laser light focusing mirror 221 and a manipulator 224.

The laser light focusing mirror 221 reflects the pulsed laser light 31 having passed through the window 215, toward the plasma generation region R1. The laser light focusing mirror 221 focuses the reflected pulsed laser light 31 on the plasma generation region R1. The laser light focusing mirror 221 is mounted on the manipulator 224. The laser light focusing mirror 221 is configured using an off-axis parabolic mirror 222 and a planar mirror 223.

The manipulator 224 is a mechanism that adjusts at least one of the position and attitude of the laser light focusing mirror 221. The manipulator 224 adjusts at least one of the position and attitude of the laser light focusing mirror 221 such that the pulsed laser light 31 is applied to the target 27 in the plasma generation region R1. The drive of the manipulator 224 is controlled by the controller 8. The manipulator 224 may be a mechanism that moves the laser light focusing mirror 221 in a direction along at least one of the X-axis and the Y-axis. The manipulator 224 may be a mechanism that moves the laser light focusing mirror 221 in a direction along the Z-axis, in addition to the X-axis and the Y-axis. The manipulator 224 may be a stage as the mechanism that adjusts at least one of the position and attitude of the laser light focusing mirror 221.

The EUV light focusing optical system 23 captures the EUV light 277 included in the radiation light 276 and focuses the EUV light 277 on an intermediate focal point IF. The EUV light focusing optical system 23 is disposed at the interior of the chamber 2. The EUV light focusing optical system 23 includes an EUV light focusing mirror 231.

The EUV light focusing mirror 231 selectively reflects the EUV light 277 of the radiation light 276 radiated from the plasma 275, in the plasma generation region R1. The EUV light focusing mirror 231 focuses the selectively reflected EUV light 277 on the intermediate focal point IF positioned in the connection part 24. The reflective surface of the EUV light focusing mirror 231 is formed, for example, by a multi-layer reflective film in which molybdenum and silicon are alternately laminated. The reflective surface of the EUV light focusing mirror 231 is formed, for example, by a part of a spheroidal surface having first and second focal points. The EUV light focusing mirror 231 is disposed such that the first focal point is positioned in the plasma generation region R1 and the second focal point is positioned at the intermediate focal point IF. A through-hole 232 is formed at the center of the EUV light focusing mirror 231. The through-hole 232 is a hole through which the pulsed laser light 31 reflected by the laser light focusing mirror 221 passes toward the plasma generation region R1.

The connection part 24 is a connection part between the chamber 2 and the exposure apparatus 9. The connection part 24 includes an unillustrated gate valve for outputting the EUV light 277 focused on the intermediate focal point IF, to the exposure apparatus 9. The gate valve included in the connection part 24 provides communication or separation between the interior of the chamber 2 and the interior of the exposure apparatus 9 in an airtight manner. At the interior of the connection part 24, a wall 241 is provided. On the wall 241, an aperture 242 is formed. The aperture 242 is formed at the position of the intermediate focal point IF.

The target supply device 25 is a device that melts the target 27 to be supplied into the chamber 2 and outputs the target 27 toward the plasma generation region R1 in the form of a droplet. The target supply device 25 is a device that outputs the target 27 by a so-called continuous jet method. The target 27 to be supplied by the target supply device 25 is formed of a metal material. The metal material forming the target 27 contains tin, terbium, gadolinium, or a combination of two or more materials of them. Preferably, the metal material forming the target 27 should be tin. The target supply device 25 is mounted on the stage 26.

The target supply device 25 is configured using a tank 251, a nozzle 252, a heater 253, a pressure adjuster 254, and a piezo element 255. The operation of the target supply device 25 is controlled by the controller 8.

The stage 26 is a mechanism that adjusts the position of the target supply device 25. The stage 26 moves the target supply device 25 in a direction along at least one of the X-axis and the Z-axis. The stage 26 adjusts the position of the target supply device 25 such that the target 27 output from the target supply device 25 is supplied to the plasma generation region R1. The drive of the stage 26 is controlled by the controller 8.

The target collector 28 is a device to collect targets 27 that are of the targets 27 put into the chamber 2 and to which the pulsed laser light 31 has not been applied. The target collector 28 is provided in the wall 211 of the chamber 2 that is on the extension of a target trajectory Q.

The target detecting sensor 41 is a sensor to detect the target 27 that passes through a target detection region R2. The target detection region R2 is a predetermined region in the chamber 2 at a predetermined position on the target trajectory Q between the target supply device 25 and the plasma generation region R1. The target detecting sensor 41 includes an illuminating unit 410 and a detecting unit 420.

The illuminating unit 410 and the detecting unit 420 are connected with the wall 211 of the target supply channel 212 through a window 216 and a window 217, respectively. The illuminating unit 410 and the detecting unit 420 are disposed so as to face each other across the target detection region R2 on the target trajectory Q. The illuminating unit 410 and the detecting unit 420 are disposed such that an illumination light axis of the illuminating unit 410 and a detection light axis of the detecting unit 420 roughly coaxially pass through the target detection region R2 as shown in FIG. 1. The illumination light axis of the illuminating unit 410 is an optical path axis of illumination light that is output from the illuminating unit 410 toward the target detection region R2. The detection light axis of the detecting unit 420 is an optical path axis of illumination light that is of the illumination light output from the illuminating unit 410 toward the target detection region R2 and that is detected by the detecting unit 420.

The illuminating unit 410 outputs the illumination light toward the target detection region R2, so as to illuminate the target 27 that passes through the target detection region R2. The illuminating unit 410 is configured using a light source 411 and an illuminating optical system 412. The detecting unit 420 detects the target 27 that passes through the target detection region R2, by detecting the light intensity of the illumination light output for illuminating the target 27 that passes through the target detection region R2. The detecting unit 420 is configured using a light sensor 421 and a light receiving optical system 422.

The EUV light sensor 43 is a sensor that measures the energy of the EUV light 277 included in the radiation light 276 radiated from the plasma 275. The EUV light sensor 43 includes a plurality of EUV light sensors 43. The EUV light sensors 43 measure the energy of the EUV light 277 from mutually different directions, and transmit measured values to the controller 8. Each operation of the EUV light sensors 43 is controlled by the controller 8. The detailed configuration of the EUV light sensor 43 will be described later, with use of FIG. 2 and FIG. 3.

The controller 8 integrally controls the operations of the elements of the EUV light generating system 11, based on a variety of commands from the exposure apparatus 9, which is an external apparatus. The controller 8 controls the laser apparatus 3, and controls the output of the pulsed laser light 31 from the laser apparatus 3. The controller 8 controls the target supply device 25, and controls the output of the target 27 from the target supply device 25. The controller 8 controls the unillustrated stage on which the high reflectance mirrors 331, 332 are mounted, and controls at least one of the position and attitude of each of the high reflectance mirrors 331, 332. The controller 8 controls the manipulator 224, and controls at least one of the position and attitude of the laser light focusing mirror 221. Thereby, the controller 8 controls the focusing position of the pulsed laser light 31 in the plasma generation region R1. The controller 8 controls the stage 26, and controls the position of the target supply device 25. Thereby, the controller 8 controls the position of the target 27 supplied to the plasma generation region R1.

The controller 8 includes a computer in which hardware such as a processor and software such as a program module are combined. The information processing by the software included in the controller 8 is specifically realized using hardware included in the controller 8.

[2.2 Operation of Comparative Example]

The controller 8 controls the target supply device 25, and outputs the target 27 from the target supply device 25 toward the plasma generation region R1. Specifically, the controller 8 heats the heater 253 of the target supply device 25 to a temperature higher than or equal to the melting point of the target 27, and melts the solid target 27 contained in the tank 251 of the target supply device 25. In the case where the metal material forming the target 27 is tin, the controller 8 heats the heater 253, for example, at a temperature higher than or equal to 250° C. and lower than or equal to 290° C., because the melting point of tin is 232° C. The controller 8 controls the pressure adjuster 254 of the target supply device 25, to give a predetermined pressure to the target 27 in the tank 251 such that the target 27 in the tank 251 is continuously output from the nozzle 252 at a predetermined speed. The controller 8 vibrates the piezo element 255 of the target supply device 25 in accordance with a predetermined waveform, divides the continuously output target 27 at a predetermined cycle to form droplet-shaped targets 27, and outputs the targets 27 from the nozzle 252 at a predetermined frequency.

The target 27 output into the chamber 2 travels on the target trajectory Q in the form of the droplet, and passes through the target detection region R2. The target 27 having passed through the target detection region R2 is supplied to the plasma generation region R1.

The target detecting sensor 41 detects the timing when the target 27 passes through the target detection region R2. Specifically, the light source 411 of the illuminating unit 410 outputs the illumination light toward the target detection region R2 through the illuminating optical system 412, so as to illuminate the target 27 that passes through the target detection region R2. The light sensor 421 of the detecting unit 420 detects the target 27 that passes through the target detection region R2, by detecting the illumination light output to the target detection region R2, through the light receiving optical system 422. The light intensity of the illumination light detected by the light sensor 421 may decrease whenever the target 27 passes through the target detection region R2. The light sensor 421 generates an output signal corresponding to the change in the light intensity of the detected illumination light, and transmits the output signal to the controller 8. The output signal corresponding to the change in the light intensity of the illumination light detected by the light sensor 421 is also referred to as a passage timing signal.

The controller 8 receives the passage timing signal transmitted from the target detecting sensor 41.

The controller 8 judges the timing when the passage timing signal becomes lower than a predetermined threshold value, as the timing when the target 27 passes through the target detection region R2. That is, the controller 8 specifies the timing when the target 27 passes through the target detection region R2, based on the detection result of the target detecting sensor 41. The controller 8 generates a target detection signal indicating that the target 27 has passed through the target detection region R2, at the timing when the passage timing signal becomes lower than the predetermined threshold value. The timing when the target 27 passes through the target detection region R2 is also referred to as merely the passage timing for the target detection region R2.

The controller 8 transmits a trigger signal to trigger the output of the pulsed laser light 31, to the laser apparatus 3, at a timing delayed by a delay time Td from the timing when the target detection signal is generated. That is, the controller 8 causes the laser apparatus 3 to output the pulsed laser light 31, at a timing after the delay time Td since the passage timing for the target detection region R2. The delay time Td is a time for making the timing when the pulsed laser light 31 is focused on the plasma generation region R1 roughly coincide with the timing when the target 27 is supplied to the plasma generation region R1. The delay time Td determines the timing when the pulsed laser light 31 is applied to the target 27 supplied to the plasma generation region R1. The delay time Td is previously stored in the controller 8. The application timing of the pulsed laser light 31 to the target 27 supplied to the plasma generation region R1 is also referred to as merely the application timing of the pulsed laser light 31.

When the laser apparatus 3 receives the trigger signal, the laser apparatus 3 outputs the pulsed laser light 31.

The pulsed laser light 31 output from the laser apparatus 3 is reflected by the high reflectance mirrors 331, 332 of the laser light delivery optical system 33, passes through the window 215, and is introduced into the chamber 2. The pulsed laser light 31 introduced into the chamber 2 is focused on the plasma generation region R1 by the laser light focusing optical system 22. The pulsed laser light 31 focused on the plasma generation region R1 is applied to the target 27 supplied to the plasma generation region R1.

By the application of the pulsed laser light 31, the target 27 supplied to the plasma generation region R1 generates plasma, and radiates the radiation light 276. The EUV light 277 included in the radiation light 276 is selectively reflected by the EUV light focusing mirror 231 of the EUV light focusing optical system 23, and is focused on the intermediate focal point IF of the connection part 24. The EUV light 277 focused on the intermediate focal point IF is output toward the exposure apparatus 9.

[2.3 EUV Light Sensor and Centroid Control of EUV Light]

Figure 2:
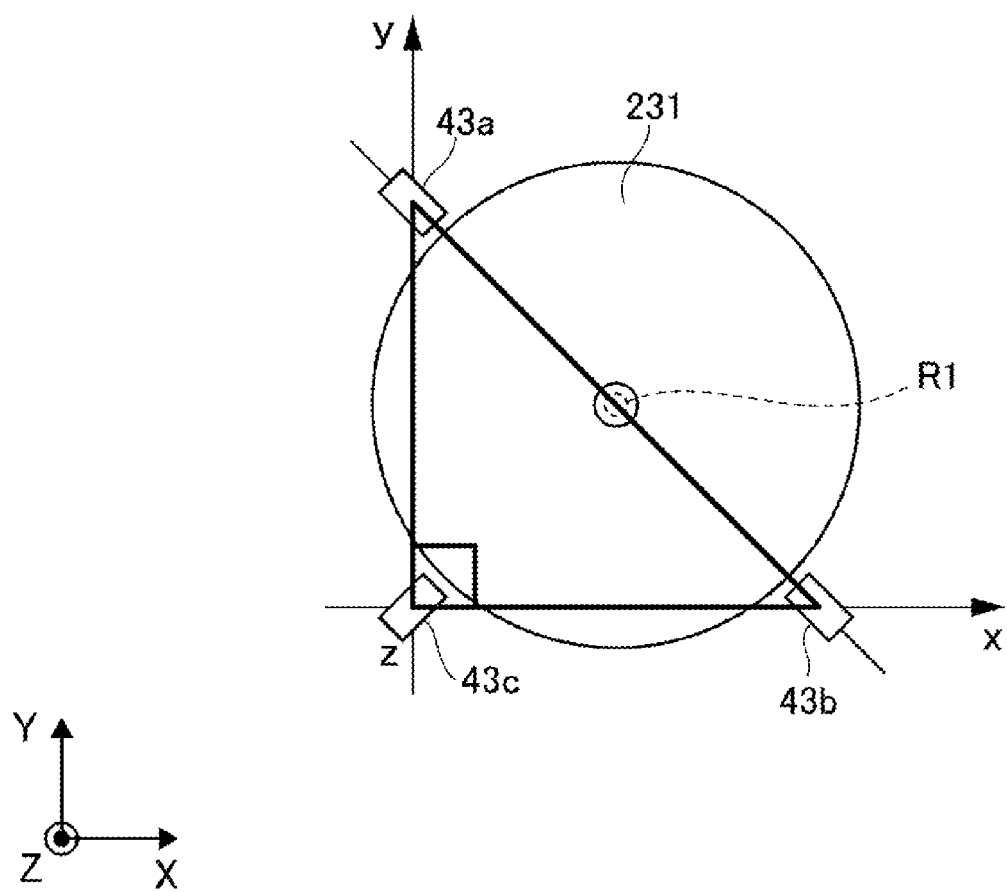
FIG. 2 shows a diagram for describing the disposition of EUV light sensors shown in FIG. 1.
Figure 3:
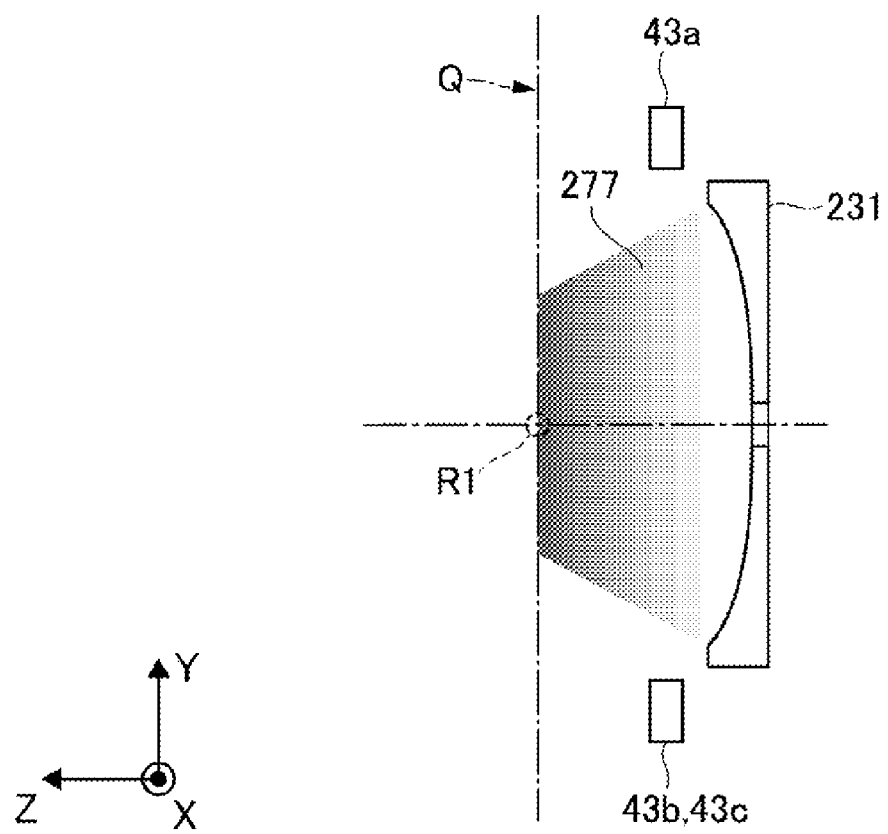
FIG. 3 shows a diagram of the disposition of the EUV light sensors shown in FIG. 2, viewed from a direction opposite to an X-axis direction.

FIG. 2 shows a diagram for describing the disposition of the EUV light sensor 43 shown in FIG. 1. FIG. 3 shows a diagram of the disposition of the EUV light sensor 43 shown in FIG. 2, viewed from a direction opposite to the X-axis direction. The plurality of EUV light sensors 43 according to the comparative example include at least three EUV light sensors 43. The plurality of EUV light sensors 43 is configured, for example, by EUV light sensors 43a to 43c, as shown in FIG. 2 and FIG. 3.

The EUV light sensors 43a to 43c are provided on the wall 211 of the chamber 2, so as to face the plasma generation region R1 from mutually different directions. The EUV light sensors 43a to 43c are disposed so as not to interrupt the optical path of the EUV light 277 reflected by the EUV light focusing mirror 231. The EUV light sensors 43a to 43c are disposed along the outer peripheral rim of the EUV light focusing mirror 231. The EUV light sensors 43a to 43c are disposed at a mutually equal distance from the plasma generation region R1, for reducing differences in energy measured by the EUV light sensors 43a to 43c when the plasma 275 is generated in the plasma generation region R1.

The EUV light sensors 43a to 43c are disposed at positions that make it easy to evaluate the centroid of the EUV light 277. For example, the EUV light sensors 43a to 43c are at the corners of an isosceles right triangle shown in FIG. 2, respectively. The isosceles right triangle shown in FIG. 2 is an isosceles right triangle in which the middle point of the long side of the triangle is positioned in the plasma generation region R1, the apex of the triangle is positioned on the Z-axis, and the two short sides are disposed along the X-axis and the Y-axis, respectively. The EUV light sensor 43a is disposed at a corner of the isosceles right triangle shown in FIG. 2 and is positioned on an axis along the Y-axis. The EUV light sensor 43b is disposed at a corner of the isosceles right triangle shown in FIG. 2 and is positioned on an axis along the X-axis. The EUV light sensor 43c is disposed at a corner of the isosceles right triangle shown in FIG. 2 and is positioned on the Z-axis.

The centroid of the EUV light 277 is the centroid in the energy distribution of the EUV light 277. That is, the centroid of the EUV light 277 is a position corresponding to the weighted average in the energy distribution of the EUV light 277. Specifically, the centroid of the EUV light 277 is a spatial position that is specified from a plurality of measured values obtained when the energy of the EUV light 277 is measured by the EUV light sensors 43a to 43c. The centroid of the EUV light 277 is an index that reflects the application position of the pulsed laser light 31 to the target 27 supplied to the plasma generation region R1. The centroid of the EUV light 277 is an index for evaluating whether or not the application condition of the pulsed laser light 31 provides satisfied properties of the EUV light 277. Such a control that the centroid of the EUV light 277 becomes a desired centroid means an appropriate application of the pulsed laser light 31 to the target 27. For example, the desired centroid is a predetermined position in the plasma generation region R1.

The controller 8 according to the comparative example defines the calculated value of Expression 1 as an evaluated value that indicates an index for evaluating an X-axis coordinate component at the centroid of the EUV light 277. The controller 8 defines the calculated value of Expression 2 as an evaluated value that indicates an index for evaluating a Y-axis coordinate component at the centroid of the EUV light 277. The definitions of the evaluated values presuppose that the desired centroid of the EUV light 277 is positioned at an equal distance from each of the EUV light sensors 43a, 43b, 43c shown in FIG. 2.

$$\text{EUV Centroid } X[\%] = \{(E2-E3)/(E2+E3)\} \times 100 \quad \text{[Expression 1]}$$

$$\text{EUV Centroid } Y[\%] = \{(E1-E3)/(E1+E3)\} \times 100 \quad \text{[Expression 2]}$$

E1 is a measured value of the EUV light sensor 43a. E2 is a measured value of the EUV light sensor 43b. E3 is a measured value of the EUV light sensor 43c. Specifically, these measured values are measured values of the energy of the EUV light 277. EUV Centroid X indicates the unevenness degree of the energy distribution of the EUV light 277 in the direction along the X-axis. EUV Centroid Y is a value resulting from standardizing the deviation between the Y-axis coordinate component at the current centroid of the EUV light 277 and the Y-axis coordinate component at the desired centroid. EUV Centroid Y indicates the unevenness degree of the energy distribution of the EUV light 277 in the direction along the Y-axis.

The controller 8 is configured to execute centroid control of the EUV light. The centroid control of the EUV light is a feedback control of controlling the laser light focusing optical system 22 such that the centroid of the EUV light 277 becomes the desired centroid, during the generation of the EUV light 277, based on the measurement results of the EUV light sensors 43a to 43c. Specifically, the controller 8 has a function to execute the following processes, as the centroid control of the EUV light.

The controller 8 transmits a first gate signal to the EUV light sensors 43a to 43c, at a timing delayed by a predetermined delay time from the timing when the target detection signal is generated. The first gate signal is a signal that triggers the measurement of the energy of the EUV light 277 by the EUV light sensors 43a to 43c. When the EUV light sensors 43a to 43c receive the first gate signal, the EUV light sensors 43a to 43c measure the energy of the EUV light 277 and transmit the measured values E1 to E3 to the controller 8, respectively. The controller 8 evaluates the centroid of the EUV light 277 using Expression 1 and Expression 2. The controller 8 specifies the deviation between the current centroid of the EUV light 277 and the desired centroid, from the respective calculated values of Expression 1 and Expression 2. The controller 8 sets a targeted application position of the application position of the pulsed laser light 31 to the target 27 supplied to the plasma generation region R1, such that the centroid of the EUV light 277 becomes the desired centroid.

Then, the controller 8 controls the laser light focusing optical system 22 depending on the set targeted application position. Specifically, the controller 8 specifies the deviation between the current application position of the pulsed laser light 31 to the target 27 supplied to the plasma generation region R1 and the targeted application position of the pulsed laser light 31 corresponding to the desired centroid. More specifically, these application positions are the focusing position of the pulsed laser light 31. Then, the controller 8 determines such a drive amount of the manipulator 224 that the deviation is eliminated. The controller 8 drives the manipulator 224 depending on the determined drive amount, and moves the focusing position of the pulsed laser light 31. Thereby, the controller 8 can make the application position of the pulsed laser light 31 to the target 27 supplied to the plasma generation region R1 roughly coincide with the targeted application position, and can make the centroid of the EUV light 277 roughly coincide with the desired centroid.

In the centroid control of the EUV light, the controller 8 may move the focusing position of the pulsed laser light 31, by driving the above-described stage on which the high reflectance mirror 331 is mounted and the above-described stage on which the high reflectance mirror 332 is mounted, instead of driving the manipulator 224. The controller 8 may drive one of the manipulator 224, the stage on which the high reflectance mirror 331 is mounted, and the stage on which the high reflectance mirror 332 is mounted, depending on the movement amount or movement speed of the focusing position of the pulsed laser light 31.

Through the execution of the centroid control of the EUV light by the controller 8, the relative positional relation between the position of the target 27 supplied to the plasma generation region R1 and the focusing position of the pulsed laser light 31 becomes an appropriate positional relation. That is, through the execution of the centroid control of the EUV light by the controller 8, the application position of the pulsed laser light 31 to the target 27 supplied to the plasma generation region R1 becomes an appropriate position.

When the relative positional relation between the position of the target 27 supplied to the plasma generation region R1 and the focusing position of the pulsed laser light 31 is mismatched, the properties of the EUV light 277 to be output from the EUV light generating apparatus 1 sometimes deteriorate. The index for evaluating the properties of the EUV light 277 is, for example, the energy or energy stability of the EUV light 277. The deterioration of the properties of the EUV light 277 means, for example, that the energy or energy stability of the EUV light 277 to be output from the EUV light generating apparatus 1 deviates from the permissible range. The energy stability of the EUV light 277 is the variation in the energy of the EUV light 277, and is described as 3σ, for example.

The application position of the pulsed laser light 31 to the target 27 supplied to the plasma generation region R1 is also referred to as merely the application position of the pulsed laser light 31. The application of the pulsed laser light 31 to the target 27 supplied to the plasma generation region R1 is also referred to as shooting. The mismatch of the relative positional relation between the position of the target 27 supplied to the plasma generation region R1 and the focusing position of the pulsed laser light 31 is also referred to as shooting mismatch.

[2.4 Problem]

The radiation light 276 radiated from the plasma 275 is thought to diverge isotropically with respect to the plasma generation region R1. Therefore, in the case where the EUV light sensors 43a to 43c have roughly the same detection sensitivity, the measured values E1 to E3 of the EUV light sensors 43a to 43c are roughly the same in a shooting condition in which the generation efficiency of the EUV light 277 is high. In this case, the calculated values of Expression 1 and Expression 2, each of which is an index for evaluating the centroid of the EUV light 277, are roughly 0 (zero), and the desired centroid is set to be zero. In the case where the calculated values of Expression 1 and Expression 2 are roughly zero, the centroid of the EUV light 277 roughly coincides with the desired centroid.

Meanwhile, there are often individual differences among the EUV light sensors 43a to 43c. Therefore, significant differences among the detection sensitivities of the EUV light sensors 43a to 43c are sometimes observed. In this case, the calculated values of Expression 1 and Expression 2 sometimes do not become roughly zero, even when the centroid of the EUV light 277 roughly coincides with the desired centroid. Further, the EUV light sensors 43a to 43c are sometimes polluted by debris, which is the target 27 not contributing to the generation of the EUV light 277. On this occasion, the manner of the pollution of the EUV light sensor 43 is sometimes different for each of the EUV light sensors 43a to 43c. In addition, the laser light focusing optical system 22 is sometimes polluted by the debris. In this case, the reflectance of the pulsed laser light 31 decreases at a pollution place, and the laser profile in the plasma generating region R1 changes. Accordingly, the radiation direction of the EUV light 277 changes, and an optimum centroid of the EUV light 277 changes.

In the above-described state, the calculated values of Expression 1 and Expression 2 sometimes do not become roughly zero even when the centroid of the EUV light 277 roughly coincides with the desired centroid. Therefore, even when the controller 8 according to the comparative example executes the EUV light centroid control by uniquely setting the desired centroid corresponding to the calculated values of Expression 1 and Expression 2 to zero, the application position of the pulsed laser light 31 sometimes does not become an appropriate position, and the shooting mismatch cannot be suppressed. The shooting mismatch leads to decrease of the efficiency of EUV light emission and increase of a pollution source of the above-described debris.

Accordingly, there has been demanded a technique of appropriately executing the EUV light centroid control by calibrating the desired centroid of the EUV light 277 and allowing the shooting mismatch to be suppressed. In addition, to maintain a high operation rate of the EUV light generating apparatus 1, there has been demanded a technique of allowing the shooting mismatch to be suppressed while generation and supply of the EUV light 277 are continued.

3. First Embodiment

An EUV light generating apparatus 1 of a first embodiment will be described with use of FIG. 1 to FIG. 10. The EUV light generating apparatus 1 of the first embodiment has a function to calibrate the desired centroid in the centroid control of the EUV light 277. In the configuration and operation of the EUV light generating apparatus 1 of the first embodiment, descriptions for the same configuration and operation as those of the EUV light generating apparatus 1 of the comparative example shown in FIG. 1 are omitted.

[3.1 Configuration]

The EUV light generating apparatus 1 of the first embodiment may include an application position adjusting unit 7 as shown in FIG. 1. The application position adjusting unit 7 is a mechanism that adjusts the application position of the pulsed laser light 31. The application position adjusting unit 7 is configured using the laser light focusing optical system 22. In the case of driving the stage on which the high reflectance mirror 331 is mounted and the stage on which the high reflectance mirror 332 is mounted in the EUV light centroid control instead of driving the manipulator 224, the application position adjusting unit 7 may be configured using these stages. Alternatively, the application position adjusting unit 7 may be configured using the stages on which the high reflectance mirrors 331 and 332 are mounted and the laser light focusing optical system 22. The operation of the application position adjusting unit 7 is controlled by the controller 8.

The controller 8 according to the first embodiment has the function to calibrate the desired centroid of the EUV light 277 in the execution of the EUV light centroid control.

The other configuration of the EUV light generating apparatus 1 of the first embodiment is the same as that of the EUV light generating apparatus 1 of the comparative example.

[3.2 Operation]

The operation of the EUV light generating apparatus 1 of the first embodiment will be described. Specifically, a process that is executed by the controller 8 according to the first embodiment for calibrating the desired centroid of the centroid control of the EUV light 277 will be described. The "desired centroid" is a control target value in the centroid control, in other words. The process that is executed by the controller 8 for calibrating the desired centroid of the EUV light 277 in the execution of the EUV light centroid control is also referred to as merely a calibration process for the desired centroid.

Figure 4:
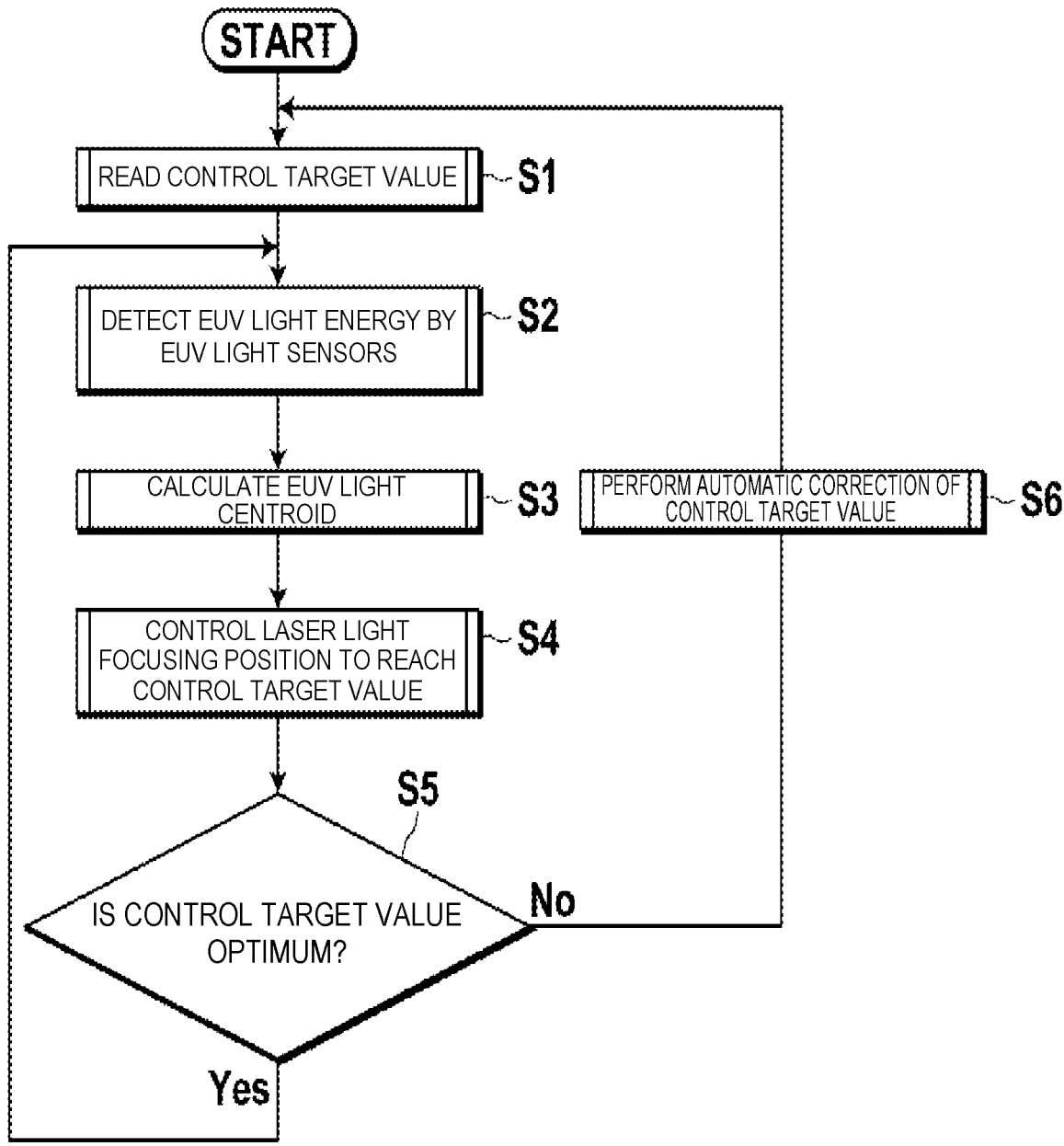
FIG. 4 shows a flowchart for describing a calibration process for a desired centroid that is executed by a controller according to a first embodiment.

FIG. 4 shows a flowchart for describing the calibration process for the desired centroid executed by the controller 8 according to the first embodiment. First in step S1, the controller 8 reads a centroid control target value, which is the desired centroid. The control target value may be first a constant value and stored in storage means. Subsequently in step S2, the controller 8 detects the energy of the EUV light 277 measured by each of the EUV light sensors 43a to 43c. Subsequently in step S3, the controller 8 calculates the current centroid of the EUV light 277. This calculation is performed with Expression 1 and Expression 2 described above. In other words, the values of EUV Centroid X and EUV Centroid Y described above are calculated also in the first embodiment.

Subsequently in step S4, the controller 8 controls the focusing position of the pulsed laser light 31 such that the calculated centroid of the EUV light 277 becomes the control target value, which is the desired centroid. Similarly to the EUV light generating apparatus 1 of the comparative example, this focusing position control is performed by driving the manipulator 224, the stage on which the high reflectance mirror 331 is mounted, or the stage on which the high reflectance mirror 332 is mounted.

The processing in steps S1 to S4 described above is basically same as the processing at the EUV light generating apparatus 1 of the comparative example described above. In the comparative example, the processing process returns from step S4 to step S2 to repeat the control of the focusing position of the pulsed laser light 31. However, in the first embodiment, unlike the EUV light generating apparatus 1 of the comparative example, processing in steps S5 and S6 is performed in addition. The processing in steps S1 to S6 may be performed in parallel with normal processing of supplying the EUV light 277 to the exposure apparatus 9.

In step S5, the controller 8 determines whether the control target value is optimum. This determination is performed by, for example, determining whether the shooting mismatch described above is reduced such that the energy of the EUV light 277 is equal to or larger than a predetermined threshold. The determination is mainly performed based on a gradient α to be described later. The energy of the EUV light 277 may be the average value of a plurality of measured values transmitted from the EUV light sensors 43a to 43c. Alternatively, the determination may be performed not only based on the energy of the EUV light 277 but also based on whether or not variation of the energy of the EUV light 277 or the value of EUV Dose Error 3σ [%] to be described later is equal to or smaller than a predetermined threshold.

When it is determined that the control target value is optimum in step S5, the processing process returns to step S2, and the following processing is repeated. When it is determined that the control target value is not optimum in step S5, the processing process proceeds to step S6 to perform automatic correction of the control target value. In the first embodiment, the automatic correction of the control target value corresponds to "desired centroid calibration" in the present disclosure.

Figure 5:
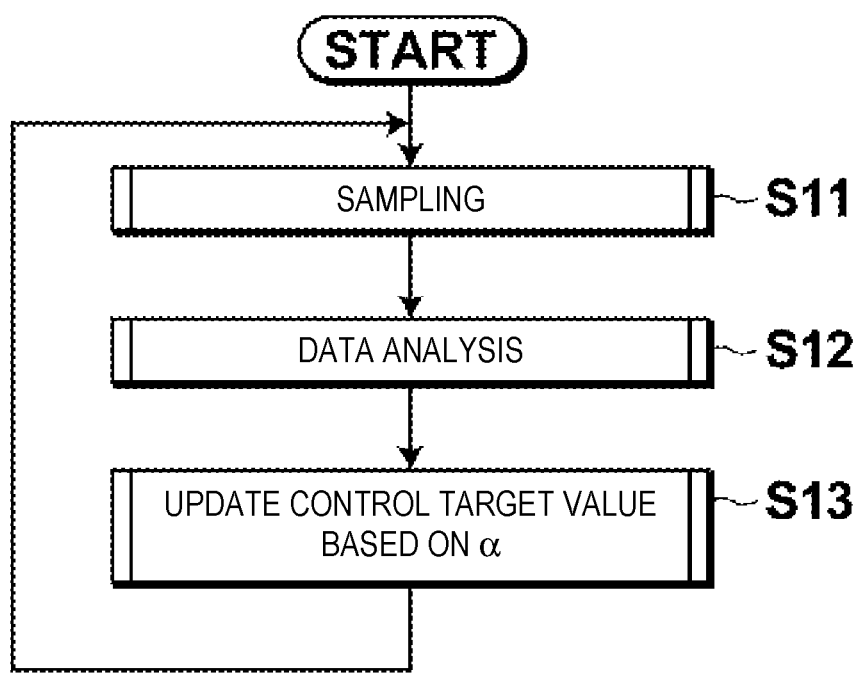
FIG. 5 shows a flowchart for describing part of the processing shown in FIG. 4.

The automatic correction of the control target value will be described in detail below with reference to FIG. 5 to FIG. 10. In the first embodiment, the burst light emission of the EUV light 277 is performed. FIG. 5 is a flowchart showing the processing performed in step S6 of FIG. 4 in detail. First in step S11, the controller 8 samples necessary data. Specifically, the controller 8 calculates, for each burst, the value of EUV Dose Error 3σ [%] to be described later, the average value of EUV Centroid X, and the average value of EUV Centroid Y. The controller 8 accumulates these values for a number N of samples with each sample obtained for a burst. The interval of the sampling is a moving interval with a window of N. Accordingly, data for latest N bursts is held. Thus, once data is accumulated for the number N of samples, the data is sequentially updated at each burst. In this case, a set of data with which the value of EUV Dose Error 3σ [%] is anomalous may be removed as an abnormal value from the samples. The number N of samples is typically 100 to 1000 approximately.

EUV Dose Error 3σ [%] will be described below. EUV Dose Error is an important index for the light amount stability of an EUV light source, and is a deviation amount (Error) of an accumulated exposure amount (Dose) from a target energy. EUV Dose Error 3σ [%] is a parameter that expresses variation of the deviation amount within one burst in 3a where a represents the standard deviation. In the present embodiment, such an EUV light desired centroid that the parameter is minimum is mainly calculated. As an example, the accumulated exposure amount (Dose) is calculated as a weighted moving average value over a certain determined interval M.

Figure 6:
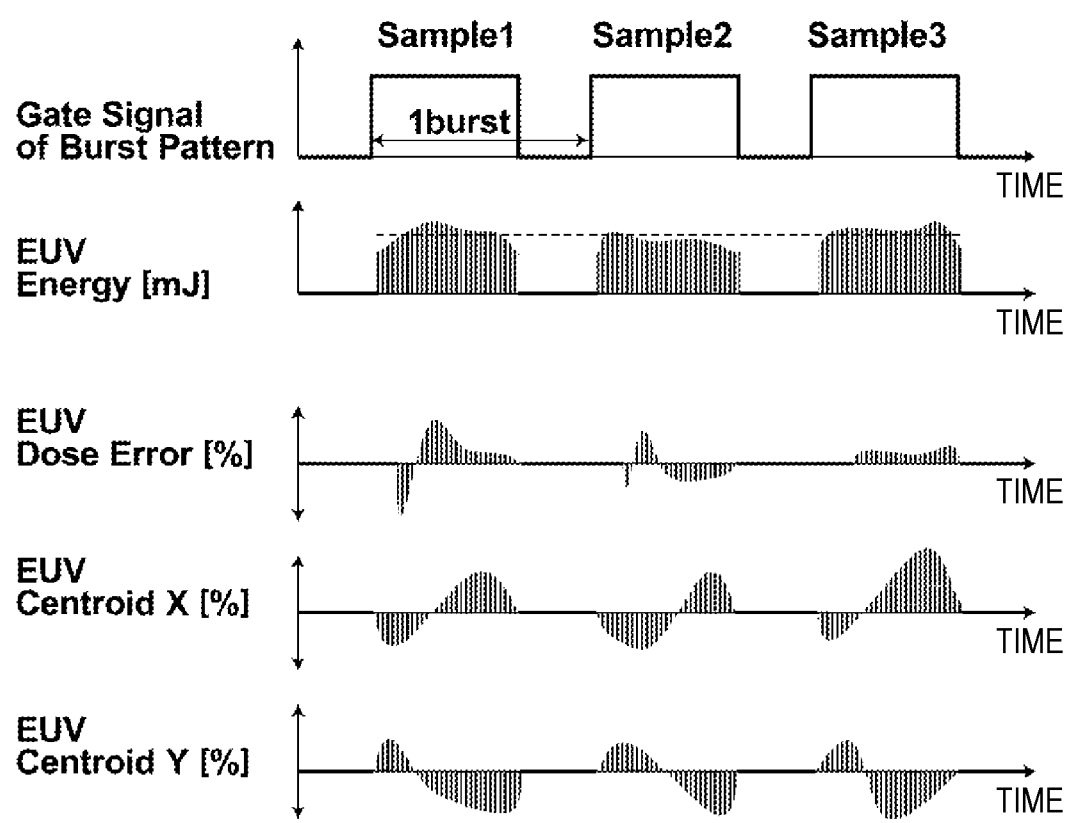
FIG. 6 shows a diagram for schematic description of data sampled in the processing shown in FIG. 4.

FIG. 6 conceptually illustrates EUV Dose Error, EUV Centroid X, and EUV Centroid Y described above. In FIG. 6, among five vertically arranged waveforms, the first waveform from the top represents the pattern of a gate signal for controlling the output duration of the laser apparatus 3, which determines a burst duration. The second waveform represents the energy of the EUV light 277. A dashed horizontal line shown together represents the target energy. The third, fourth, and fifth waveforms conceptually represent EUV Dose Error, EUV Centroid X, and EUV Centroid Y, respectively.

Figure 7:
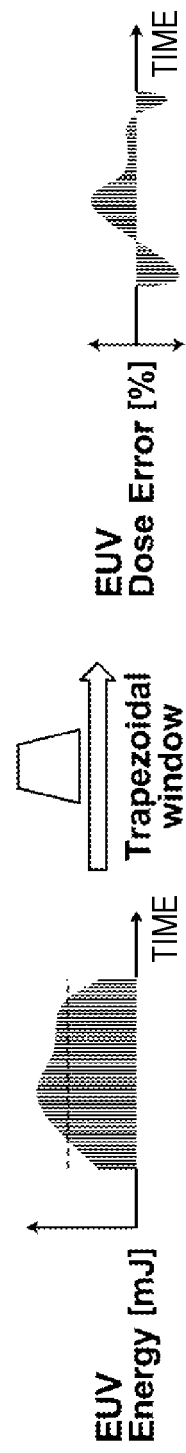
FIG. 7 shows a diagram for schematic description of the sampling performed in the processing shown in FIG. 4.

A moving window may be preferably used to calculate the moving average value. The window may be shaped in a rectangle or trapezoid. For example, when the frequency of the pulsed laser light 31 applied to the target 27 is 100 kHz, a typically used trapezoid window has a rise interval of 300 pulses and a fall interval of 300 pulses with the interval M of 800 pulses. FIG. 7 conceptually shows the trapezoid window and EUV Dose Error. In FIG. 7, the trapezoid window is schematically shown at the center in the horizontal direction. The energy of the EUV light 277 is shown on the left side of the window. A dashed horizontal line shown together represents the target energy. EUV Dose Error as the deviation between the energy of the EUV light 277 and the target energy is conceptually shown on the right side of the trapezoid window.

In the example shown in FIG. 7, when the burst light emission is started and the first pulse of each burst is emitted, measurement of the energy of the EUV light 277 as the exposure amount (Dose) is started. The energy of the EUV light 277 may be, for example, the average value of energies measured by the EUV light sensors 43a to 43c or an energy measured by any one of the EUV light sensors 43a to 43c. Then, calculation of EUV Dose Error is started when the energy measured value has been accumulated for one window width (M=800 pulses), and the calculation is continued until the last pulse in one burst is measured. When the calculation has been performed for one burst, the value of EUV Dose Error 3σ [%] related to the one burst is calculated.

Figure 8:
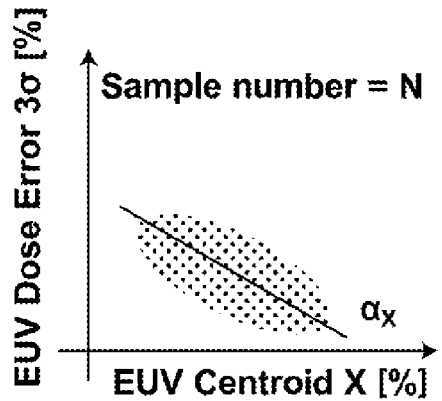
FIG. 8 shows a diagram for describing calibration process for a desired centroid executed by a controller according to a first embodiment.
Figure 9:
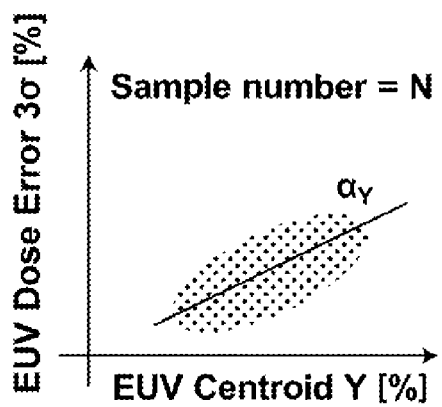
FIG. 9 shows a diagram for describing the calibration process for the desired centroid executed by the controller according to the first embodiment.

Subsequently in step S12 of FIG. 5, the controller 8 performs data analysis as described below. Specifically, the controller 8 approximates, by a linear function as shown in FIG. 8, the relation between the value of EUV Dose Error 3σ [%] calculated for each burst as described above for a total of N bursts and the average value of EUV Centroid X, and calculates a gradient $\alpha_X$ of the function. In addition, the controller 8 approximates, by a linear function as shown in FIG. 9, the relation between the value of EUV Dose Error 3σ [%] calculated for each burst for a total of N bursts and the average value of EUV Centroid Y, and calculates a gradient $\alpha_Y$ of the function.

Figure 10:
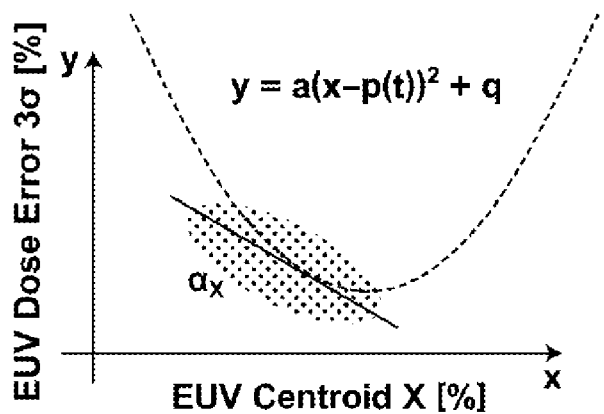
FIG. 10 shows a diagram for describing the calibration process for the desired centroid executed by the controller according to the first embodiment.

Subsequently in step S13 of FIG. 5, the controller 8 updates the control target value of the centroid of the EUV light 277, which is the desired centroid, based on the value of the gradient ax and the value of the gradient $\alpha_Y$. The update will be described below with reference to FIG. 10. In the following description, the centroid of the EUV light 277 is simply referred to as a "centroid" in some cases. The following description will be made on calibration of the control target value of the X-axis coordinate component of the centroid, but also applies to calibration of the control target value of the Y-axis coordinate component of the centroid. The X-axis coordinate and the Y-axis coordinate are a coordinate in the X direction and a coordinate in the Y direction, respectively, shown in FIG. 1 as described above. The following description employs an XY orthogonal coordinate system with the value of EUV Centroid X on the X coordinate and the value of EUV Dose Error 3σ [%] on the Y coordinate as shown in FIG. 10.

It is known that the relation between EUV Centroid X indicating the centroid and EUV Dose Error 3σ [%] can be approximated by a second-order polynomial near a region in which the latter has an extreme value. A relational expression taking into account temporal change of the optimum centroid control target value due to debris or the like described above can be obtained as $$y=a(x-p(t))^2+q$$

where the function p(t) expresses change of the X coordinate of the extreme value in accordance with time t. $C_t$ represents the centroid control target value as the function of time t, and $C_{t,x}$ [%] represents the X coordinate of the control target value. With this notation, a state in which $C_{t,x}$ [%] is p(t) means an optimum centroid state in which EUV Dose Error 3σ [%] is minimum. A relational expression of EUV Dose Error 3σ [%] for EUV Centroid X [%] can be obtained by the following approximate expression at the initial state (t=0).

$$y=a(x-p(0))^2+q$$

Specifically, the relational expression can be obtained by spatially scanning the focusing position of the pulsed laser light 31 on the target 27 controlled to reach the plasma generating region R1 while EUV optical output control is activated.

When $\alpha_X$ calculated in step S5 of FIG. 5 is taken as a differential coefficient y' ($C_{t,x}$) at $C_{t,x}$ [%], the following expression is obtained from the expression of $y=a(x-p(t))^2+q$:

$$p(t)=y'(C_{t,x})/(-2a)+C_{t,x}=\alpha_x/(-2a)+C_{t,x} \quad \text{[Expression 3]}$$

Thus, a new centroid control target value $C_{nt,x}$ is expressed as follows by using a proportional gain $K_p$:

$$C_{nt,x}=K_p(p(t)-C_{t,x})+C_{t,x} \quad \text{[Expression 4]}$$

Accordingly, in step S13 of FIG. 5, the controller 8 updates the control target value of the centroid of the EUV light 277 based on the value of the gradient $\alpha_x$. As the update is performed, the value of the gradient $\alpha_x$ becomes closer to zero, and the centroid control target value is set to a more appropriate value. In the first embodiment, the control target value may be updated without considering the proportional gain $K_p$, in other words, by setting the gain $K_p$ to 1 in Expression 4.

In the first embodiment, the centroid control target value is inappropriate in a case of y'≠0, but a dead zone in which the update of the control target value is not executed may be provided by using a threshold $\alpha_{th}$ to be described later. Appropriate constants a and q may be determined by experiment or the like in advance.

The other operation of the EUV light generating apparatus 1 of the first embodiment is same as that of the EUV light generating apparatus 1 of the comparative example.

[3.3 Effect]

The controller 8 in the first embodiment can calibrate the desired centroid of the EUV light 277 to a more appropriate position each time the centroid of the EUV light 277 is controlled. Specifically, when the measurement accuracy of the EUV light sensor 43 is unstable due to influence of, for example, detection sensitivity and pollution conditions, the controller 8 can calibrate the desired centroid to an optimum position with the measurement accuracy taken into account. Accordingly, the EUV light generating apparatus 1 of the first embodiment can constantly execute appropriate EUV light centroid control, and thus can control the application position of the pulsed laser light 31 to an appropriate position. As a result, the EUV light generating apparatus 1 of the first embodiment can suppress the shooting mismatch and performance degradation of the EUV light 277. In addition, the EUV light generating apparatus 1 of the first embodiment can suppress the shooting mismatch while generation and supply of the EUV light 277 are continued, and thus can maintain a high operation rate.

4. Second Embodiment

[4.1 Configuration]

The EUV light generating apparatus 1 of a second embodiment will be described below with reference to FIG. 11. The EUV light generating apparatus 1 of the second embodiment is different from the EUV light generating apparatus 1 of the first embodiment in the processing of updating the control target value, which is the desired centroid, in the centroid control of the EUV light 277 in step S13 of FIG. 5. The controller 8 in the EUV light generating apparatus 1 of the second embodiment may have a configuration for executing this different processing. The other configuration of the EUV light generating apparatus 1 of the second embodiment may be same as that of the EUV light generating apparatus 1 of the first embodiment.

[4.2 Operation]

Figure 11:
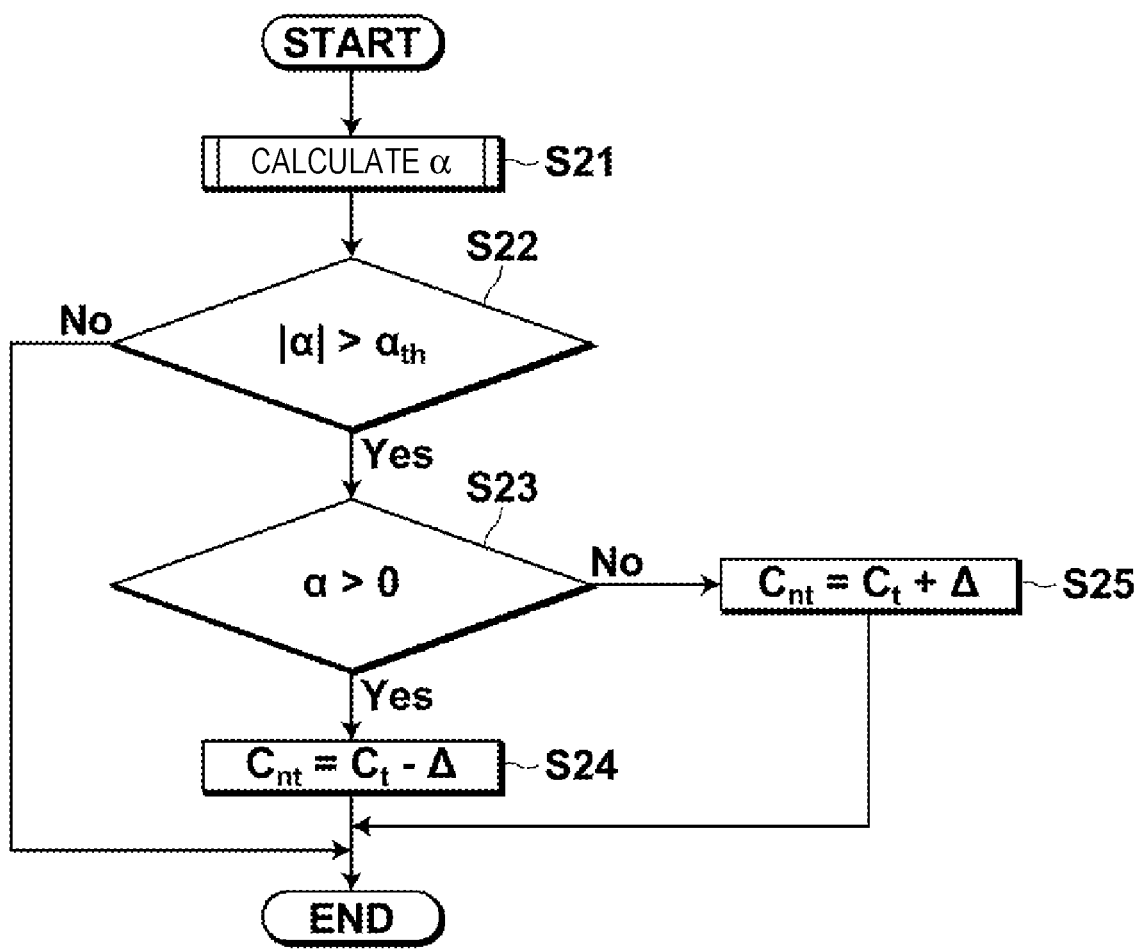
FIG. 11 shows a flowchart for describing the calibration process for the desired centroid executed by the controller according to a second embodiment.

FIG. 11 is a flowchart illustrating processing of updating the control target value of the centroid of the EUV light 277, which may be executed in place of the processing performed in step S6 of FIG. 4. This processing will not be described separately for calibration of the control target value of the X-axis coordinate component and calibration of the control target value of the Y-axis coordinate component. The control target value of the X-axis coordinate component can be calibrated by using the gradient $\alpha_x$ shown in FIG. 8 as the gradient α shown in FIG. 11. The control target value of the Y-axis coordinate component can be calibrated by using the gradient $\alpha_Y$ shown in FIG. 9 thereas.

First in step S21, the controller 8 calculates the gradient $\alpha$. This calculation may be performed in a manner same as that in the first embodiment. Subsequently in step S22, the controller 8 compares the absolute value of the gradient $\alpha$ with the predetermined threshold $\alpha_{th}$. When the absolute value of the gradient $\alpha$ is smaller than the threshold $\alpha_{th}$, the controller 8 determines that the processing of updating the control target value is unnecessary, and ends the series of processing. When the absolute value of the gradient $\alpha$ is larger than the threshold $\alpha_{th}$, the controller 8 determines whether the value of the gradient $\alpha$ is positive or negative in step S23. When the value of the gradient $\alpha$ is positive, the controller 8 calculates a new centroid control target value $C_{nt}$ by subtracting a constant correction amount $\Delta$ from the current control target value $C_t$ in step S24. When the value of the gradient $\alpha$ is negative, the controller 8 calculates a new centroid control target value $C_{nt}$ by adding the constant correction amount $\Delta$ to the current control target value $C_t$ in step S25.

In the processing shown in FIG. 4, the absolute value of the gradient $\alpha$ is gradually changed to a smaller value as the above-described processing is repeated in place of step S6. Then, in step S22, it is determined that the absolute value of the gradient $\alpha$ is smaller than the threshold $\alpha_{th}$. Accordingly, the controller 8 determines that the processing of updating the control target value is unnecessary, and ends the series of processing. The threshold $\alpha_{th}$ is typically 0.001 to 1 approximately, and the constant correction amount $\Delta$ is typically a minute amount of 0.0001% to 0.1% approximately. When the threshold $\alpha_{th}$ has such a value, the value of the gradient $\alpha$ is gradually changed closer to zero in the present embodiment. In this manner, as the processing shown in FIG. 4 is repeated, the centroid control target value is set to a more appropriate value based on the value of the gradient $\alpha$ close to zero.

[4.3 Effect]

According to the EUV light generating apparatus 1 of the second embodiment that operates as described above, effects same as those in the first embodiment can be basically achieved. In addition, according to the EUV light generating apparatus 1 of the second embodiment, the centroid control target value is gradually set to an optimum value as the processing of subtracting or adding the constant correction amount $\Delta$ is repeated.

5. Third Embodiment

[5.1 Configuration]

The EUV light generating apparatus 1 of a third embodiment will be described below with reference to FIG. 12. The EUV light generating apparatus 1 of the third embodiment is different from the EUV light generating apparatus 1 of the first embodiment shown in FIG. 1 in that a beam splitter 500 and a laser light sensor 501 are provided. The beam splitter 500 is inserted on the optical path of the pulsed laser light 31 traveling from the laser apparatus 3 toward the laser light focusing optical system 22, and reflects part of the pulsed laser light 31 and transmits the rest. The laser light sensor 501 detects the energy of the part of the pulsed laser light 31 reflected by the beam splitter 500. The EUV light generating apparatus 1 of the third embodiment is also different from the EUV light generating apparatus 1 of each of the first embodiment and the second embodiment in the processing of calibrating the control target value of the centroid of the EUV light 277. The controller 8 in the EUV light generating apparatus 1 of the third embodiment may have a configuration for executing this different processing. The other configuration of the EUV light generating apparatus 1 of the third embodiment may be same as that of the EUV light generating apparatus 1 of the first embodiment or the second embodiment.

[5.2 Operation]

Figure 13:
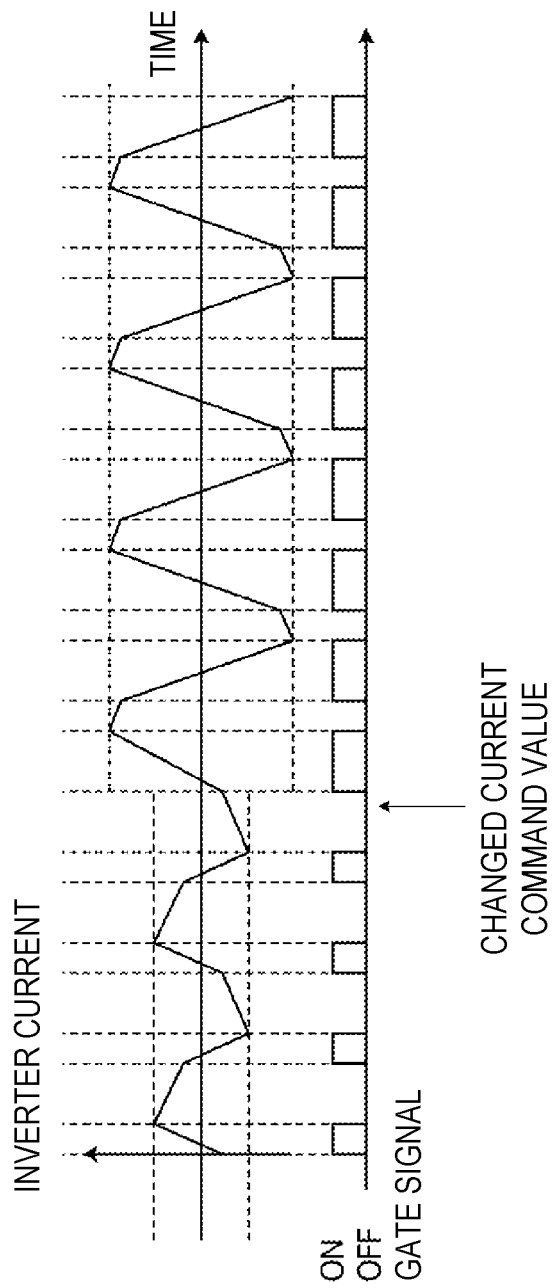
FIG. 13 shows a diagram for describing the duty ratio of current for generating a laser light.

The EUV light generating apparatus 1 of each of the first embodiment and the second embodiment calibrates the centroid control target value based on the relation between EUV Centroid X and EUV Dose Error 3σ [%] and the relation between EUV Centroid Y and EUV Dose Error 3σ [%]. However, in the present disclosure, the centroid control target value may be calibrated by using another parameter in place of EUV Dose Error 3σ [%]. Such a parameter may be a parameter related to the energy of the EUV light 277 or a parameter related to the energy of the pulsed laser light 31. Specifically, the former parameter is, for example, a 3σ value indicating energy variation between a plurality of rays of the EUV light 277 when the burst light emission or the like is performed. The latter parameter is, for example, the duty ratio [%] of inverter current output from an inverter circuit included in a power source of a light amplifier configured to amplify pulsed laser light. Alternatively, the latter parameter is a 3σ value indicating variation of the duty ratio. FIG. 13 shows an exemplary waveform of the inverter current. The value of the inverter current is changed by a gate signal as a current command value as shown in FIG. 13, and the width of the gate signal corresponds to the duty ratio. In addition, the former or latter parameter is, for example, EUV conversion efficiency. The EUV conversion efficiency is the ratio of the EUV light emission energy relative to the incident energy of the pulsed laser light 31 on the plasma generating region R1.

When the various parameters as described above are each used, the value of the parameter may be plotted on the vertical axis in FIG. 10 in place of EUV Dose Error 3σ [%], and processing same as that in the embodiments described above may be performed. However, when the EUV conversion efficiency is used as the parameter, the gradient $\alpha$ of a straight line passing near the maximum value of the EUV conversion efficiency is calculated. Then, an approximate curve that shows distribution of the EUV conversion efficiency protrudes upward. Accordingly, in the processing as shown in FIG. 11, the process proceeds to step S24 when the determination result in step S23 is No, or step S25 when the determination result is Yes.

Figure 12:
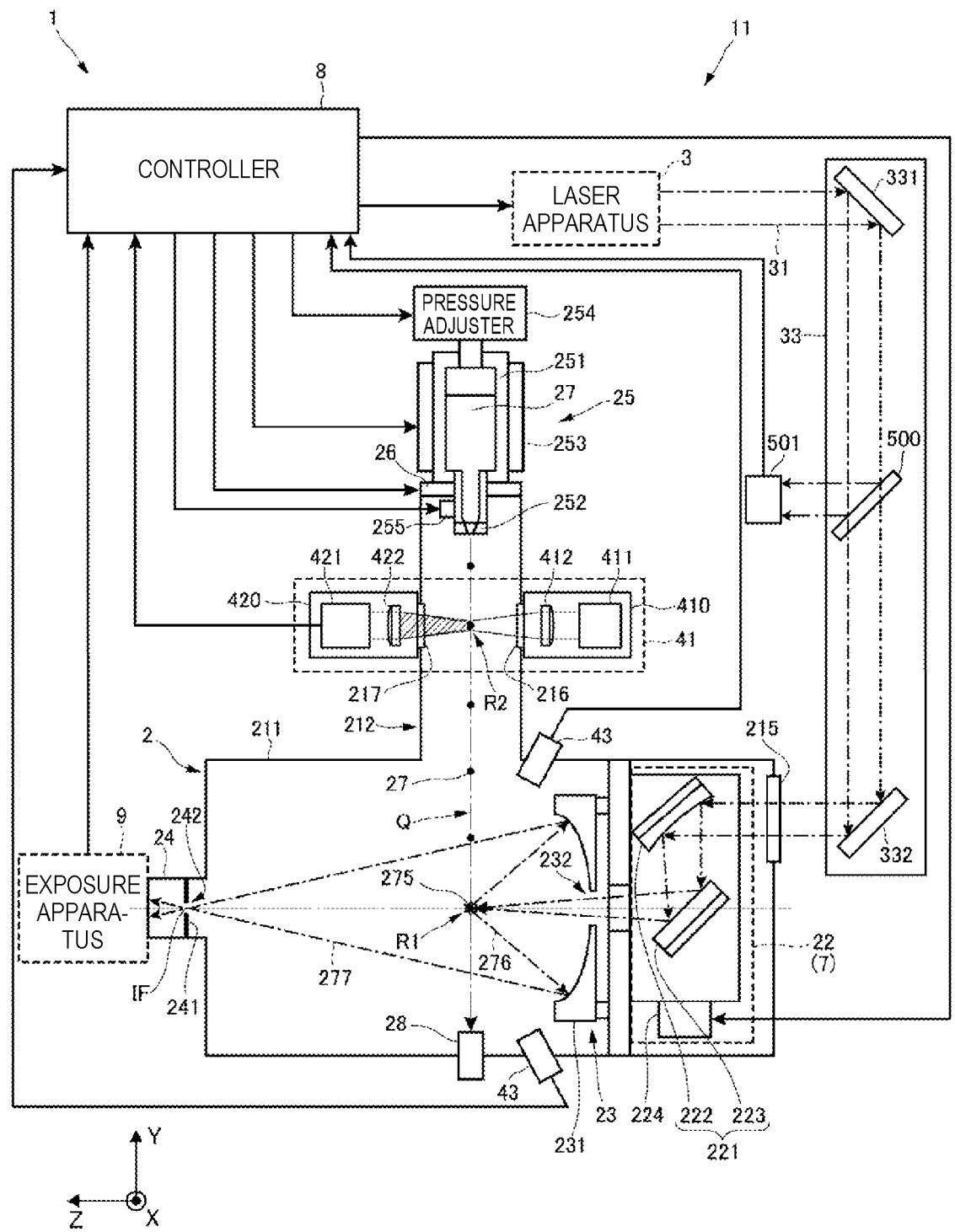
FIG. 12 shows a diagram for describing the configuration of an EUV light generating apparatus according to the second embodiment.

The beam splitter 500 and the laser light sensor 501 shown in FIG. 12 are provided to use a parameter related to the energy of the pulsed laser light 31, or a parameter related to both of the parameter related to the energy of the pulsed laser light 31 and the energy of the EUV light 277. Specifically, in this case, the energy of the pulsed laser light 31 bifurcated by the beam splitter 500 is detected by the laser light sensor 501. Then, an output from the laser light sensor 501 is input to the controller 8.

[5.3 Effect]

According to the EUV light generating apparatus 1 of the third embodiment that operates as described above, effects same as those in the first embodiment can be basically achieved.

6. Others

In the above-described embodiments, it is obvious to those in the art that techniques in the embodiments including modifications can be applied to each other.

The above description is intended to be not limitations but just examples. Accordingly, it is obvious to those skilled in the art that the embodiments in the present disclosure can be modified without departing from the accompanying claims.

The terms used in the whole of the present specification and the accompanying claims should be understood as "non-limitative" terms. For example, the term "including" or "included" should be understood as "not limited to the description about the including or included". The term "having" should be understood as "not limited to the description about the having". Further, it should be understood that a modifier "one" described in the present specification and the accompanying claims means "at least one" or "one or more".

What is claimed is:

1. An EUV light generating apparatus comprising:
a plurality of EUV light sensors configured to measure energy of EUV light from mutually different directions, the EUV light being generated by applying laser light to a target supplied to a predetermined region in a chamber;
a stage on which mirrors are mounted configured to adjust an application position of the laser light to the target supplied to the predetermined region; and
a controller configured to control the stage on which mirrors are mounted such that a centroid of the EUV light becomes a desired centroid, the centroid of the EUV light being specified from measurement results of the EUV light sensors, the controller correcting the desired centroid based on a plurality of EUV light centroids obtained from the energy of the EUV light measured by the EUV light sensors, and a parameter related to the measured energy of the EUV light corresponding to the EUV light centroids, wherein
the controller corrects the desired centroid by using, as the parameter, variation of a difference between the measured energy of the EUV light and a target energy.

2. The EUV light generating apparatus according to claim 1, wherein
the controller calculates, based on standard deviation, the variation of the difference between the measured energy of the EUV light and the target energy.

3. The EUV light generating apparatus according to claim 1, wherein
the stage on which mirrors are mounted includes
a focusing mirror configured to focus the laser light to the predetermined region, and
a manipulator configured to adjust at least one of a position and an attitude of the focusing mirror.

4. An EUV light generating apparatus comprising:
a plurality of EUV light sensors configured to measure energy of EUV light from mutually different directions, the EUV light being generated by applying laser light to a target supplied to a predetermined region in a chamber;
a stage on which mirrors are mounted configured to adjust an application position of the laser light to the target supplied to the predetermined region; and
a controller configured to control the stage on which mirrors are mounted such that a centroid of the EUV light becomes a desired centroid, the centroid of the EUV light being specified from measurement results of the EUV light sensors, the controller correcting the desired centroid based on a plurality of EUV light centroids obtained from the energy of the EUV light measured by the EUV light sensors, and a parameter related to the measured energy of the EUV light corresponding to the EUV light centroids, wherein
the controller approximates a relation between the EUV light centroids and the parameter by a linear function, and corrects the desired centroid based on a gradient of the linear function.

5. The EUV light generating apparatus according to claim 4, wherein
the controller corrects the desired centroid by using, as the parameter, a difference between the measured energy of the EUV light and a target energy.

6. The EUV light generating apparatus according to claim 4, wherein
the controller corrects the desired centroid by using variation of the measured energy of the EUV light as the parameter.

7. The EUV light generating apparatus according to claim 4, wherein
the controller repeats the correction of the desired centroid such that a value of the gradient gradually becomes closer to zero.

8. The EUV light generating apparatus according to claim 4, wherein
the stage on which mirrors are mounted includes
a focusing mirror configured to focus the laser light to the predetermined region, and
a manipulator configured to adjust at least one of a position and an attitude of the focusing mirror.

9. An EUV light generating apparatus comprising:
a plurality of EUV light sensors configured to measure energy of EUV light from mutually different directions, the EUV light being generated by applying laser light to a target supplied to a predetermined region in a chamber;
a stage on which mirrors are mounted configured to adjust an application position of the laser light to the target supplied to the predetermined region; and
a controller configured to control the stage on which mirrors are mounted such that a centroid of the EUV light becomes a desired centroid, the centroid of the EUV light being specified from measurement results of the EUV light sensors,
the controller correcting the desired centroid based on a plurality of EUV light centroids obtained from the energy of the EUV light measured by the EUV light sensors, and a parameter related to energy of laser light applied to the EUV light centroids.

10. The EUV light generating apparatus according to claim 9, wherein
the controller corrects the desired centroid by using, as the parameter, variation of energy of laser light applied to the EUV light centroids.

11. The EUV light generating apparatus according to claim 9, wherein
the controller corrects the desired centroid by using, as the parameter, a duty ratio of current at an amplifier configured to amplify the laser light.

12. The EUV light generating apparatus according to claim 9, wherein
the controller corrects the desired centroid by using, as the parameter, variation of a duty ratio of current at an amplifier configured to amplify the laser light.

13. The EUV light generating apparatus according to claim 9, wherein
the controller corrects the desired centroid by using, as the parameter, a ratio of measured energies of EUV light corresponding to the EUV light centroids relative to energy of laser light applied to the EUV light centroids.

* * * * *